(12) United States Patent
Senowitz

(10) Patent No.: US 9,779,910 B1
(45) Date of Patent: Oct. 3, 2017

(54) UTILIZATION OF VOLTAGE CONTRAST DURING SAMPLE PREPARATION FOR TRANSMISSION ELECTRON MICROSCOPY

(71) Applicant: QUALCOMM Incorporated, San Diego, CA (US)

(72) Inventor: Corey Senowitz, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/264,478

(22) Filed: Sep. 13, 2016

(51) Int. Cl.
*G01N 23/00* (2006.01)
*H01J 37/22* (2006.01)
*H01J 37/305* (2006.01)
*H01J 37/28* (2006.01)

(52) U.S. Cl.
CPC .............. *H01J 37/22* (2013.01); *H01J 37/28* (2013.01); *H01J 37/3056* (2013.01); *H01J 2237/24564* (2013.01); *H01J 2237/24592* (2013.01)

(58) Field of Classification Search
CPC .......... H01J 37/00; H01J 37/02; H01J 37/226; H01J 37/244; H01J 37/252; H01J 37/26; H01J 37/261; H01J 37/263; H01J 37/265; H01J 37/28; H01J 37/3005; H01J 37/305; H01J 37/3053; H01J 37/31; H01J 37/22; H01J 2237/31713; H01J 2237/31749; H01J 2237/2802

USPC ................... 250/304, 306, 307, 311
See application file for complete search history.

(56) References Cited

U.S. PATENT DOCUMENTS

| | | | |
|---|---|---|---|
| 6,586,733 B1 * | 7/2003 | Veneklasen | H01J 37/26 250/307 |
| 7,427,753 B2 | 9/2008 | Pearl | |
| 7,525,325 B1 * | 4/2009 | Jenkins | G01R 31/307 250/306 |
| 8,779,400 B2 | 7/2014 | Shichi et al. | |
| 9,184,025 B2 | 11/2015 | Young et al. | |
| 9,281,163 B2 | 3/2016 | Routh, Jr. et al. | |
| 2008/0078750 A1 * | 4/2008 | Boguslavsky | H01J 37/147 219/121.41 |
| 2015/0369710 A1 | 12/2015 | Fuller et al. | |

* cited by examiner

*Primary Examiner* — Jason McCormack
(74) *Attorney, Agent, or Firm* — Haynes and Boone, LLP

(57) ABSTRACT

Transmission electron microscopes (TEMs) are being utilized more often in failure analysis labs as processing nodes decrease and alternative device structures, such as three dimensional, multi-gate transistors, e.g., FinFETs (Fin Field Effect Transistors), are utilized in IC designs. However, these types of structures may confuse typical TEM sample (or "lamella") preparation as the resulting lamella may contain multiple potentially faulty structures, making it difficult to identify the actual faulty structure. Passive voltage contrast may be used in a dual beam focused ion beam (FIB) microscope system including a scanning electron microscope (SEM) column by systematically identifying non-faulty structures and milling them from the lamella until the faulty structure is identified.

30 Claims, 5 Drawing Sheets

UTILIZATION OF VOLTAGE CONTRAST DURING SAMPLE PREPARATION FOR TRANSMISSION ELECTRON MICROSCOPY

TECHNICAL FIELD

This application relates to failure analysis in integrated circuits (ICs) using electron microcopy, and more particularly to IC failure analysis and identification of region of interest in three-dimensional device structures using electron microscopy.

BACKGROUND

Integrated circuits (ICs) are typically designed using software tools in which designers can combine known components to produce a model for an actual IC. The software can also predict the operation of the modeled device, and the designer can make corrections based on the simulated operation of the modeled circuitry. However, when the IC design is sent to the foundry that produces the actual prototype IC, unexpected defects may occur due to increasingly complicated processing techniques. Such defects are exacerbated as transistor dimensions decrease and advanced processing techniques are utilized. For example, the use of resolution enhancement techniques such as optical proximity correction, phase shift masks, and double patterning lead to variations in lithography that are difficult to accurately model during the design process. Variations in chemical mechanical planarization due to surface density effects and other issues can also contribute to this problem.

When defects either due to the circuit design itself or to the foundry process are detected, the circuit designer may send the defective IC to a failure analysis team to identify the defect so that the design may be corrected. Some defects can be observed using non-destructive techniques, e.g., electro-optical techniques such as LVP (Laser Voltage Probing), SDL (Soft Defect Localization), and LADA (Laser Assisted Device Alteration), among others.

However, some defects require destructive failure analysis methods in which the IC is milled down to a thin film in order to find the region of interest (ROI) for fault detection. One such technique is transmission electron microscopy (TEM), which is commonly used for fault analysis for the latest process nodes (10 nm to 20 nm). At these advanced process nodes, transmission electron microscopy is the only technique with the resolution to pinpoint physical defects in the analyzed integrated circuit.

To employ TEM, the IC being analyzed is milled into thin samples denoted as "lamellae" (plural). A resulting lamella is then subjected to relatively intense electron bombardment (e.g., in a range of 30 kV to 300 kV with 200 kV being typical). The electrons are imaged after passing through the lamella (hence the use of "transmission" in Transmission Electron Microscopy). The relatively large amounts of power used to excite the electrons in TEM causes the electrons to have relatively short wavelengths. As a result, TEM has much finer resolution than other electron-based microscopy techniques, such as scanning electron microscopy (SEM). The resolution for TEM can thus extend down to the atomic scale, which is very useful for isolating faults in modern process nodes.

Although TEM provides robust resolution, the milling of the lamellae becomes problematic at advanced process nodes. In particular, modern process nodes have moved from the traditional planar transistor architectures to three-dimensional structures such as in a fin-shaped field effect transistor (FinFET). FIG. 1 shows an exemplary FinFET transistor 100. FinFETs differ from planar CMOS (Complementary Metal Oxide Semiconductor) devices in that in a CMOS transistor, a gate controls a channel through only one plane. In such planar processes, the gate may not have good control of the channel, exhibiting leakage currents between the source and drain even when the gate is off. In contrast, in FinFET transistors, the channel is a thin vertical fin 105 with the gate (or "finger") 110 fully wrapped around three sides of the channel. The channel is thus controlled from three planes, which provides better resistance to leakage as compared to planar architectures. In even more advanced nodes, the fin is processed into a nanowire such that the gate completely surrounds the channel. This results in much better control of a highly depleted channel, and thus lower leakage.

The use of TEM for FinFET fault analysis is limited by the three dimensional nature of FinFETs. For example, a lamella may include a plurality of fins 105. In contrast, a lamella for an older process node (a planar technology such as CMOS) has a more homogenous structure such as a single drain, or a single gate, etc. In contrast, a conventional lamella for a TEM analysis of a FinFET will capture multiple fingers or fins. The initial lamella must be relatively thick as the fault (prior to TEM analysis) cannot be isolated to a single fin or finger (gate) but instead only to a collection of these structures. These multiple structures force the microscopist to continue the milling of the lamella until a single FinFET structure is captured in the lamella. For example, the lamella may be milled down until a single fin 105 or gate 110 is isolated.

Although the resulting thinned lamella is then relatively homogeneous such that it is amenable to a subsequent TEM analysis, the microscopist must make an informed guess as to which structure to isolate. The guess may of course be wrong such that another lamella must be milled. Each milling and TEM imaging process may take several days such that the fault analysis becomes protracted. Or worse yet, the failure may be a one-of-a-kind sample that was lost during the milling for the selection of the wrong feature.

Accordingly, there is a need in the art for improved failure analysis for three dimensional device structures, such as FinFETs.

SUMMARY

To improve the milling of lamellae for electron microscopy of three-dimensional transistors, a fault analysis system in which voltage contrast is used to guide a focused ion beam (FIB) milling device during the lamellae milling. Through the voltage contrast, an electron microscope images a potentially faulty structure within the lamella (note that the terms "lamella" and "sample" are used interchangeably herein to refer to structure resulting from the focused ion beam milling). The fault may be identified by determining whether an image produced by the electron microscope of the sample includes a voltage contrast artifact, which may be dark (indicating an open circuit) or bright (indicating a short). If the structure is determined to include a fault such as through the voltage contrast indicating that one structure (e.g., a gate) is shorted to another structure (e.g., the substrate), the sample may be milled using the focused ion beam to include only the faulty structure, which may then be used as a lamella for TEM (Transmission Electron Microscopy).

If the sample contains three or more potentially faulty structures and one of these structures is determined not to include a fault, the sample may be milled down to expose another one of the structures in the sample for further fault analysis and so on until a faulty structure is identified. In this manner, the faulty structure may be identified systematically, avoiding unnecessary milling and fault analysis operations.

These and additional advantages may be better appreciated through the following detailed description.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figure.

DETAILED DESCRIPTION

A dual-beam focused ion beam (FIB) milling apparatus and technique is provided that addresses the shortcomings of conventional sample preparation for a transmission electron microscope (TEM) fault analysis. The use of TEM for FinFET fault analysis has heretofore been limited by the three dimensional nature of FinFETs as a conventional lamella for a TEM analysis of a FinFET will capture multiple fingers or fins.

Figure 1:
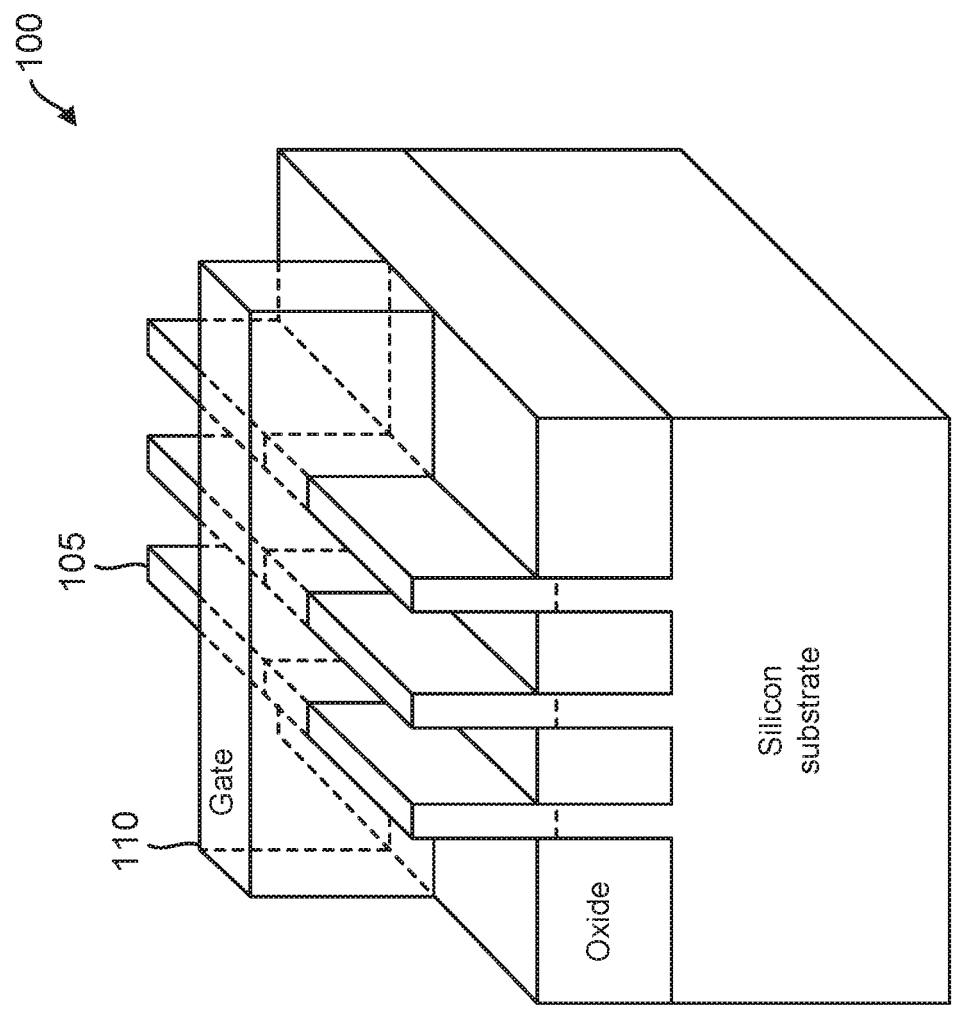
FIG. 1 is perspective view of an exemplary Fin Field Effect Transistor (FinFET).
Figure 2:
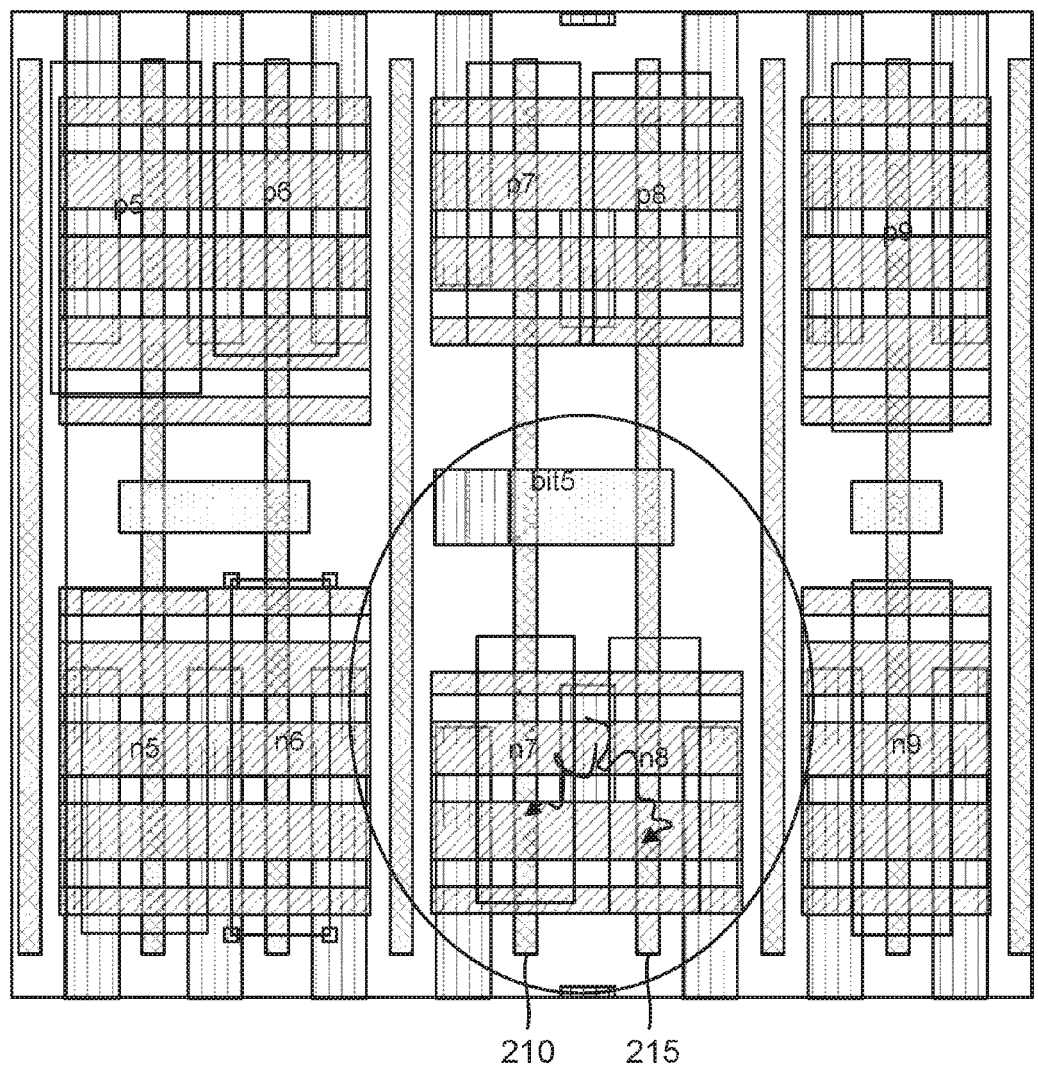
FIG. 2 is a plan view of multiple potentially faulty structures in a FinFET device.

FIG. 2 shows an example where a failure could only be electrically isolated down to two physical gate fingers, denoted as n7 210 and n8 215, which is a common occurrence in FinFET fault analysis. In the example, a TEM analysis of the sample did not reveal a defect. The microscopist could guess which of the two was the defective finger, but a wrong guess could result in the analysis needing to be repeated multiple times from the beginning, which could take several days for each sample preparation and analysis. Or worse yet, if it were a one-of-a-kind sample, there would be no way to recover the lost data.

In an embodiment, milling of a lamella containing multiple potentially faulty components in a three dimensional transistor structure, such as a pair of FinFET fingers, may be guided by voltage contrast SEM imaging such that the milling narrows down the sample to isolate the faulty structure and produce a lamella containing only the faulty structure for TEM analysis.

Figure 3:
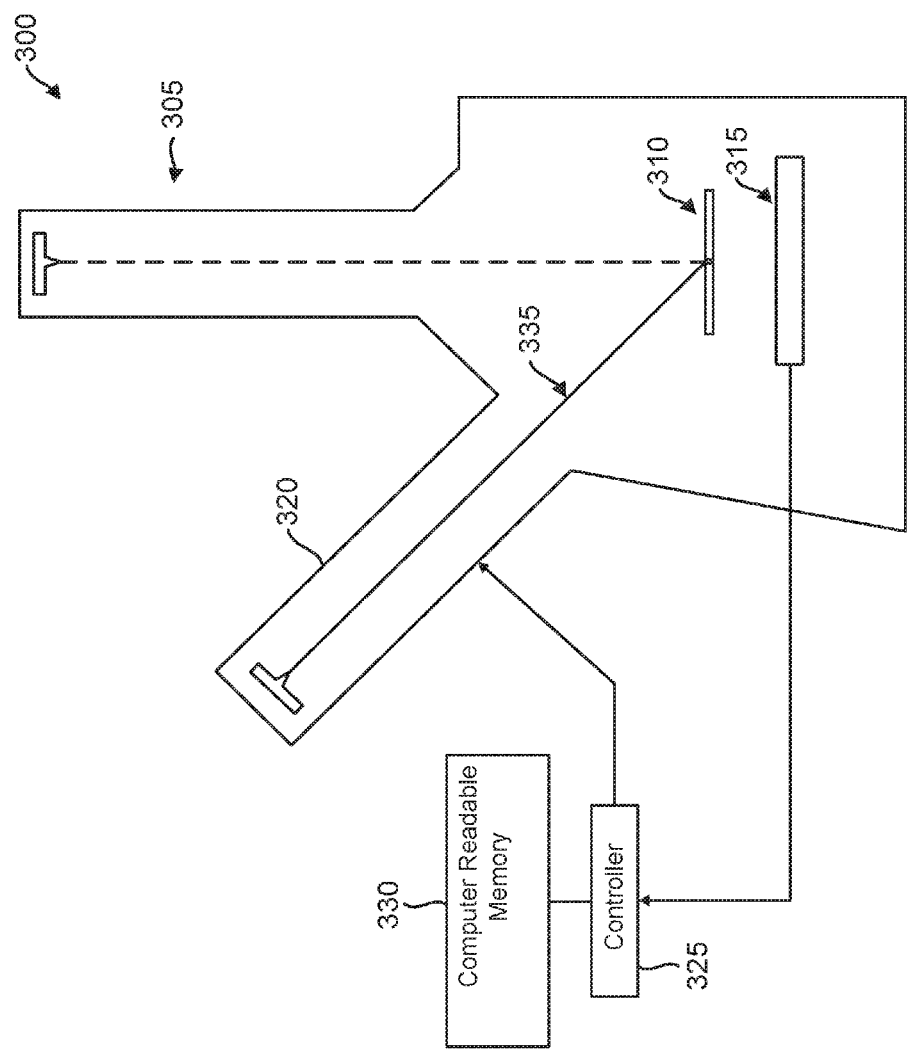
FIG. 3 is a schematic of a fault analysis system according to an embodiment.

FIG. 3 shows an exemplary electron microscopy failure analysis system 300 that can be used to identify faults in three dimensional transistor structures. System 300 includes an SEM 305 to image a sample 310 on a platform 315, a dual beam focused ion beam (FIB) column 320 to mill sample 310 to a desired thickness, a controller 325 to control the platform 315, SEM 305 and FIB 320, and a computer-readable memory 330 to store failure analysis data and instructions for controller 325.

In order to improve preparation of lamellae for TEM fault analysis, a dual beam FIB sample preparation process may be modified to include passive voltage contrast. In a dual beam FIB milling process of a IBM lamella, a beam of ions 335 (for example Ga+ ions) performs the milling. This milling is guided by the imaging from a scanning electron beam, hence the "dual beam" nature of such FIB milling. In a conventional dual beam FIB process, the energy (kV) of the electron beam may be too high to permit the voltage contrast process. This is done deliberately since, as noted above, the resolution of electron microscopy increases as the kV magnitude increases for electron excitation.

Passive voltage contrast allows for the evaluation of suspect structures for either elevated leakage or resistivity based on the comparison of secondary electron (SE) emission levels relative to similar reference structures. This technique may be utilized in a FIB or SEM, with the SEM becoming the tool of choice for continually shrinking geometries. In the past, this technique has been applied in a plan view orientation for planar technologies such as CMOS, with the sample taken from a wafer pulled at a specific level during processing, or on a fully processed chip that has subsequently been de-processed down to the layer of interest (typically a metal or contact layer). This phenomenon has also been utilized in the FIB cross-sectioning of defects on bulk samples.

In the FIB 320, passive voltage contrast is inherent because the imaging species (Ga+ ions) has a positive charge. The phenomenon of SEM-based passive voltage contrast exists because at an appropriately low accelerating voltage, the number of SEs that exit the sample outnumber the primary electrons from the SEM, resulting in a net positive surface charge on the sample. In the case of an "open" structure, i.e., when the voltage contrast is dark, there is no path to ground so a positive surface charge accumulates, resulting in reduced SE emission and darker contrast as compared to a similar non-failing structure. In the case of a "shorted" structure, i.e., the voltage control is bright, the short provides a path to ground to reduce the build-up of the positive surface charge. Thus more SEs are able to escape relative to a non-defective structure, so it appears differentially bright.

Achieving passive voltage contrast during TEM lamellae creation requires a low accelerating voltage in the SEM, which also results in a reduction in resolution. However, using low-kV SEM for TEM sample preparation has several advantages in addition to passive voltage contrast. First of all, low-kV SEM is more surface sensitive, which aids in proper end-pointing on each side of a TEM lamella by minimizing the SEs generated from the interior of the lamella. In addition, low-kV SEM minimizes the "charging" effect exhibited by non-conductive portions of the sample. These charging effects reduce image quality and can make proper end-pointing more challenging. Finally, low-kV SEM minimizes electron beam damage to sensitive low-kV dielectric materials.

In an embodiment, TEM sample preparation occurs in the dual beam FIB 320, which utilizes a Ga+ ion beam to mill a bulk sample into a suitable TEM lamella. This process is monitored using the in-situ SEM 305 column. This allows each side of the lamella to be observed while thinning using SEM voltage contrast to detect a defective structure, which will exhibit differential contrast if it is shorted to another structure (bright) or open (dark). This phenomenon can be used strategically by starting out with a thick lamella (too thick for quality TEM imaging), where each of the two or more fingers (gates) in the original sample can be examined for abnormal voltage contrast in the SEM column. Once it is determined which finger exhibits abnormal voltage contrast, the lamella can be milled to the location of the defective finger.

Figure 4:
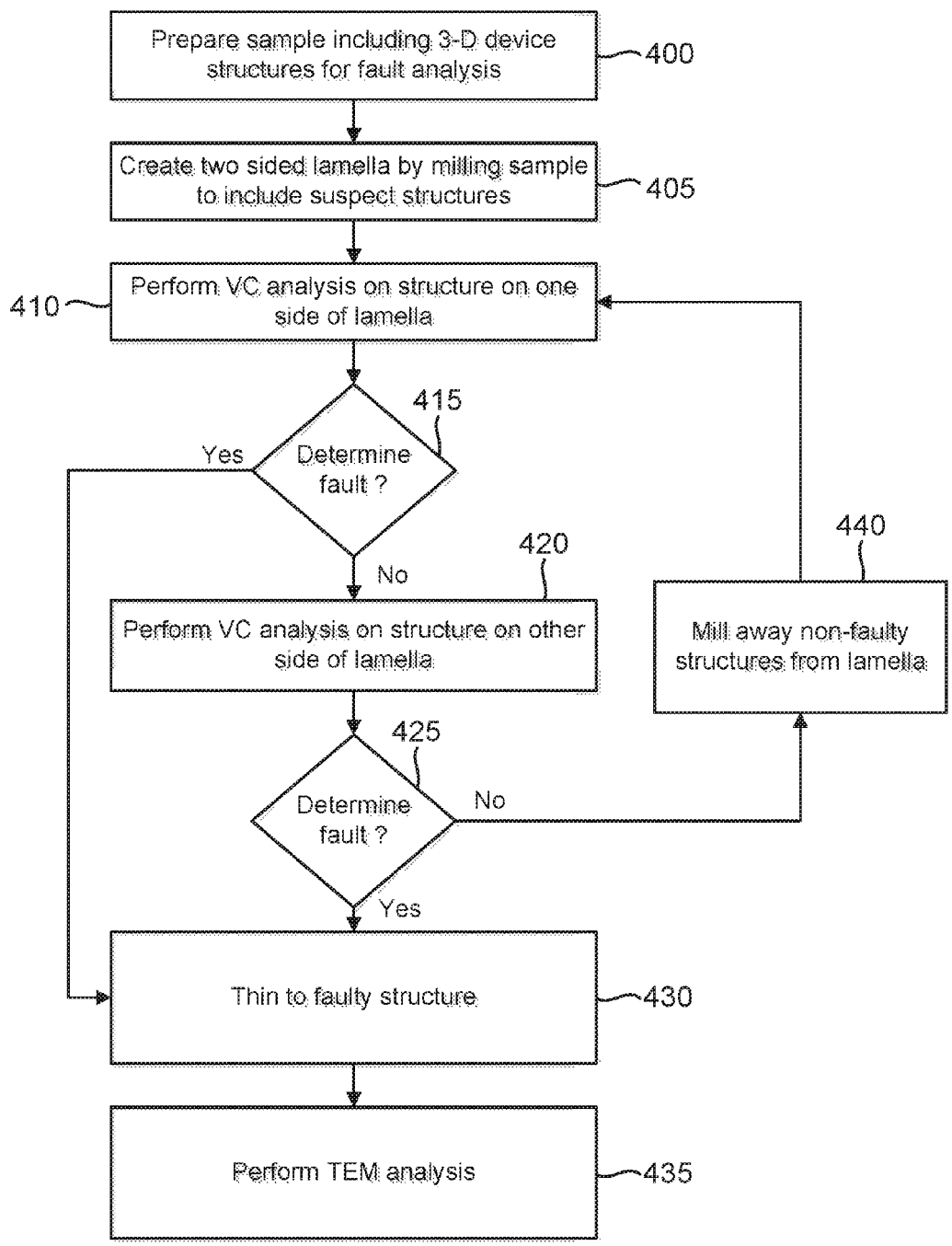
FIG. 4 is a flowchart describing a method of using the system of FIG. 3 for fault analysis according to an embodiment.
Figure 5:
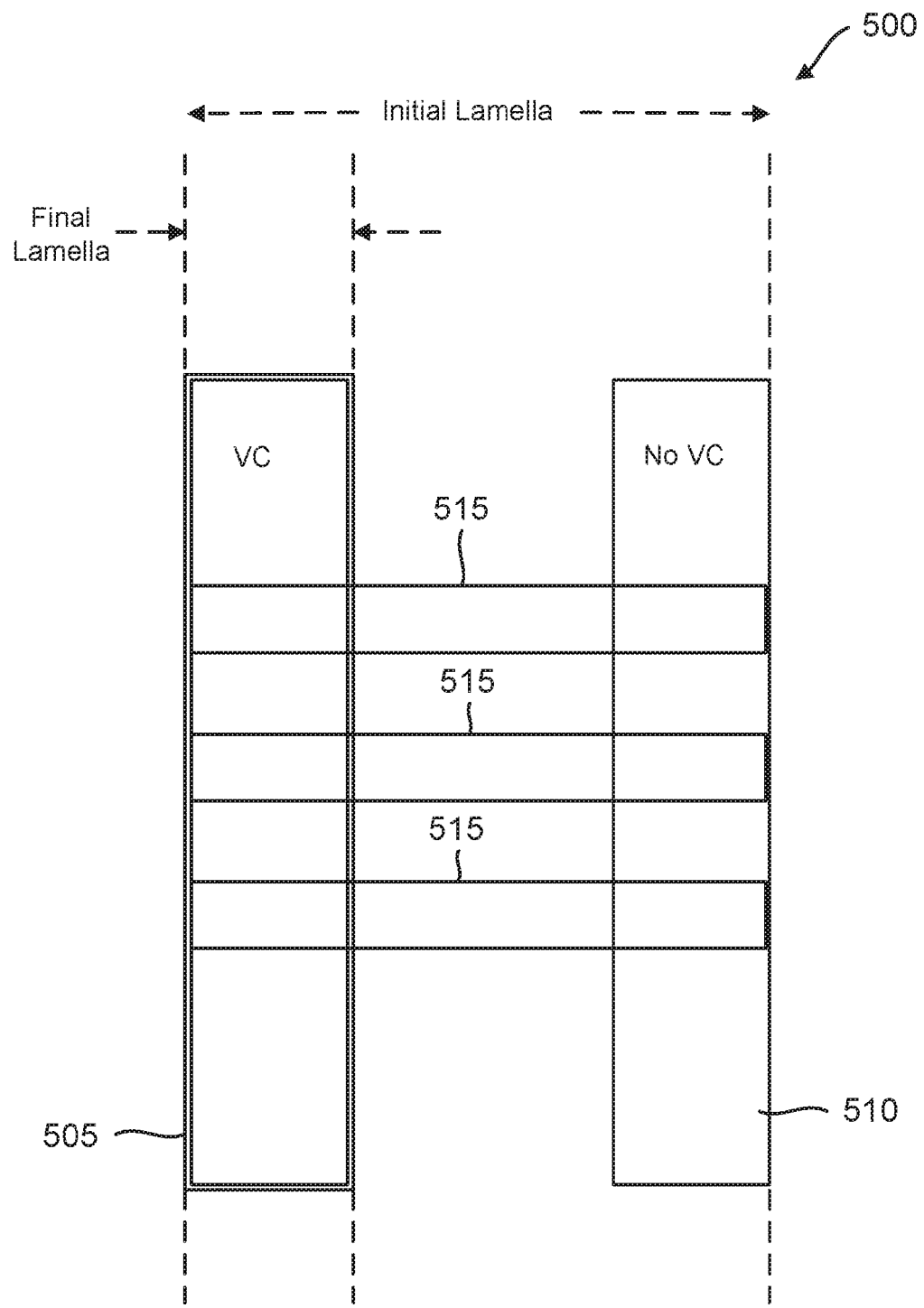
FIG. 5 shows an exemplary sample for fault analysis using the system of FIG. 3.

FIG. 4 is a flowchart describing an exemplary method for preparing a lamella for TEM analysis from a sample including multiple potentially faulty structures in a three dimensional transistor structure. In an act 400, a sample determined to include a fault in one of multiple fingers is prepared for analysis in the failure analysis system 300. Then in an act 405 the sample is milled down to a lamella 500 including potentially faulty fingers, 505 and 510, on either side of the lamella 500, as shown in FIG. 5. The fins 515 are aligned orthogonally to the fingers 505 and 510. The longitudinal axis of the lamella 500 is thus aligned with the longitudinal axis of the fingers 505 and 510.

In an act 410, a voltage contrast SEM imaging is performed on a finger on one side of the two-sided lamella 500. Next, in an act 415, it is determined whether the finger contains a fault. In this example, finger 510 was imaged and was dark (no outline) since it is electrically isolated indicating that it is normal. Next, assuming no fault was found on the previously analyzed finger, a voltage contrast SEM imaging is performed on the finger 505 on the opposite side of the lamella in an act 420.

Again, in act 425, it is determined whether the finger contains a fault. In this example, the finger 505 is bright, indicating that is faulty due to its path to ground. In this case, the method would proceed to act 430, in which the lamella would be milled down to the faulty finger 505. The resulting structure is relatively homogeneous and may be readily imaged through a subsequent TEM analysis in act 435 so as to identify its fault.

In the event of the lamella includes more than two fingers, and if both fingers on either side of the lamella are determined not to contain a fault, the lamella may be milled to the next finger inside the lamella for voltage contrast SEM imaging in an act 440, and the process continued until the faulty finger was identified.

Once the faulty finger is identified, the FIB milling is guided to thin the lamella to include just the faulty finger and TEM analysis would be performed in act 435.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. An apparatus for detecting defects in a two-sided sample including three-dimensional transistor circuitry, comprising:
   an electron microscope operative to produce an image of one or more structures in the sample and produce a voltage contrast in the image in an area of a faulty structure;
   a focused ion beam operative to mill material from the sample; and
   a processor configured to:
   control the electron microscope to image a first transistor structure on a first side of the sample to determine through voltage contrast whether the first transistor structure is defective,
   control the electron microscope to image a second transistor structure on a second side of the sample responsive to a determination that the first transistor structure is not defective, and
   control the focused ion beam to mill the sample to include only the first structure responsive to a determination that the first transistor structure is defective.

2. The apparatus of claim 1, wherein the processor is further configured to:
   determine through voltage contrast whether the second transistor structure is defective, and
   control the focused ion beam to mill the sample to include only the second transistor structure.

3. The apparatus of claim 2, wherein the processor is further configured to:
   operate the focused ion beam to mill the sample to a next potentially faulty structure in the sample responsive to a determination that the second transistor structure is not defective.

4. The apparatus of claim 1, wherein the electron microscope comprises a scanning electron microscope (SEM).

5. The apparatus of claim 1, wherein the first transistor structure and the second transistor structure are both Fin Field Effect Transistor (FinFET) structures.

6. The apparatus of claim 5, wherein the first transistor structure comprises a gate in the FinFET.

7. The apparatus of claim 5, wherein the first transistor structure comprises a gate electrode in the FinFET.

8. The apparatus of claim 1, wherein determining through voltage contrast whether the first transistor structure is defective comprises determining whether the voltage contrast is a dark artifact.

9. The apparatus of claim 1, wherein determining through voltage contrast whether the first transistor structure is defective comprises determining whether the voltage contrast is a bright artifact.

10. A method for detecting defects in a two-sided sample including three-dimensional transistor circuitry, comprising:
    imaging a first transistor structure through an electron microscope on a first side of the sample while detecting a voltage contrast for the sample;
    imaging a second transistor structure on a second side of the sample through the electron microscope responsive to the first transistor structure not having a voltage contrast compared to a non-defective transistor structure, and
    milling the sample with a focused ion beam until the sample excludes the second transistor structure responsive to the first transistor structure having a voltage contrast compared to the non-defective transistor structure.

11. The method of claim 10, further comprising:
    imaging the second transistor structure through the electron microscope while detecting a voltage contrast for the second transistor structure; and
    milling the sample with the focused ion beam until the sample excludes the first transistor structure responsive to second transistor having a voltage contrast compared to a non-defective transistor structure.

12. The method of claim 11, further comprising:
    in an event of detecting no voltage contrast in the second transistor structure, operating the focused ion beam to mill the sample to a next potentially faulty structure in the sample.

13. The method of claim 10, wherein the electron microscope comprises a scanning electron microscope (SEM).

14. The method of claim 10, wherein the first transistor structure and the second transistor structure are both fin-shaped field effect transistor (FinFET) structures.

15. The method of claim 10, wherein the voltage contrast comprises a dark artifact compared to the non-defective transistor structure.

16. The method of claim 10, wherein the voltage contrast comprises a bright artifact compared to the non-defective transistor structure.

17. An apparatus for detecting defects in a two-sided sample including three-dimensional circuitry, comprising:
 an electron microscope operative to produce an image of one or more structures in the sample and detect a voltage contrast in the image in an area of a faulty structure;
 a focused ion beam operative to mill material from the sample;
 means for operating the electron microscope to image a first structure on the first side of the sample;
 means for operating the electron microscope to image a second structure on a second side of the sample responsive to the first structure not having a voltage contrast compared to a non-defective structure; and
 means for operating the focused ion beam to mill the sample to include only the first structure in the event of the first structure having a voltage contrast compared to the non-defective structure.

18. The apparatus of claim 17, further comprising:
 means for determining whether the image of the second structure comprises a voltage contrast in the event of imaging the second structure, and
 means for operating the focused ion beam to mill the sample to include only the second structure in the event of detecting a voltage contrast in the second structure.

19. The apparatus of claim 18, further comprising:
 means for operating the focused ion beam to mill the sample to a next potentially faulty structure in the sample in the event of detecting no voltage contrast in the second structure.

20. The apparatus of claim 17, wherein the electron microscope comprises a scanning electron microscope (SEM).

21. The apparatus of claim 17, wherein the sample comprises structures in a Fin Field Effect Transistor (FinFET).

22. The apparatus of claim 17, wherein the voltage contrast comprises a dark artifact.

23. The apparatus of claim 17, wherein the voltage contrast comprises a bright artifact.

24. A computer-readable medium, including instructions for detecting defects in a two-sided sample including three-dimensional circuitry and operative to cause a processor to:
 operate an electron microscope to image a first structure on a first side of the sample, and
 in the event of detecting no voltage contrast in first structure, operate the electron microscope to image a second structure on a second side of the sample, and in the event of detecting a voltage contrast in the first structure, operate a focused ion beam to mill the sample to include only the first structure.

25. The computer-readable medium of claim 24, further comprising instructions operative to cause the processor to:
 in the event of imaging the second structure, determine whether the image of the second structure comprises a voltage contrast, and
 in the event of detecting a voltage contrast in the second structure, operate a focused ion beam to mill the sample to include only the second structure.

26. The computer-readable medium of claim 25, further comprising instructions operative to cause the processor to:
 in the event of detecting no voltage contrast in the second structure, operate the focused ion beam to mill the sample to a next potentially faulty structure in the sample.

27. The computer-readable medium of claim 24, wherein the electron microscope comprises a scanning electron microscope (SEM).

28. The computer-readable medium of claim 24, wherein the sample comprises structures in a Fin Field Effect Transistor (FinFET).

29. The computer-readable medium of claim 24, wherein the voltage contrast comprises a dark artifact.

30. The computer-readable medium of claim 24, wherein the voltage contrast comprises a bright artifact.

* * * * *